United States Patent
Ju

(10) Patent No.: US 9,211,612 B2
(45) Date of Patent: Dec. 15, 2015

(54) ELECTRICAL CONNECTOR

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 31 days.

(21) Appl. No.: 14/302,189

(22) Filed: Jun. 11, 2014

(65) Prior Publication Data

US 2015/0244083 A1    Aug. 27, 2015

(30) Foreign Application Priority Data

Feb. 27, 2014  (CN) ...................... 2014 2 0085437 U

(51) Int. Cl.
| | |
|---|---|
| H01R 3/08 | (2006.01) |
| B23K 35/00 | (2006.01) |
| H01R 12/52 | (2011.01) |
| H01R 43/02 | (2006.01) |
| H05K 13/00 | (2006.01) |

(52) U.S. Cl.
CPC ................ B23K 35/00 (2013.01); H01R 12/52 (2013.01); H01R 43/0256 (2013.01); H05K 13/00 (2013.01)

(58) Field of Classification Search
CPC .......... H01R 3/08; H01R 13/03; H01R 13/50; H01R 13/2421; H01R 13/2414; H01R 12/52; H01R 12/0256; H01K 13/00
USPC ............................................. 439/179
See application file for complete search history.

(56) References Cited

U.S. PATENT DOCUMENTS

| | | | | | |
|---|---|---|---|---|---|
| 7,147,478 | B1* | 12/2006 | Ju | ............................ | H01R 3/08 439/178 |
| 7,731,513 | B1* | 6/2010 | Lin | ..................... | H01R 13/2421 439/179 |
| 2007/0128906 | A1* | 6/2007 | Kazama | ............. | G01R 1/06722 439/179 |
| 2007/0232103 | A1* | 10/2007 | Matsuo | .............. | H01R 13/2414 439/179 |

* cited by examiner

*Primary Examiner* — Jean F Duverne
(74) *Attorney, Agent, or Firm* — Locke Lord LLP; Tim Tingkang Xia, Esq.

(57) ABSTRACT

An electrical connector for electrically connecting a first electronic element to a second electronic element, includes an insulating body having multiple receiving holes. Each receiving hole is internally provided with a conducting assembly. The conducting assembly includes a first conductor and a liquid metal conductor. At least one part of the first conductor is a conducting layer arranged at an inner wall of the receiving hole. The liquid metal conductor is made of gallium or gallium alloy. The receiving hole is internally provided with a plug, and a receiving cavity is formed above the plug. One end of the first conductor is formed into a welding portion. The liquid metal conductor is received in the receiving cavity, and electrically connected to the first electronic element and the first conductor.

13 Claims, 10 Drawing Sheets

ELECTRICAL CONNECTOR

CROSS-REFERENCE TO RELATED APPLICATION

This non-provisional application claims priority under 35 U.S.C. §119(a) on Patent Application No. 201420085437.5 filed in P.R. China on Feb. 27, 2014, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector, and particularly to an electrical connector electrically connecting a first electronic element and a second electronic element.

BACKGROUND OF THE INVENTION

An electrical connector is generally used for transmitting a signal between two electronic elements which are not directly electrically connected. For example, a signal is transmitted between a chip module and a circuit board by using an electrical connector. The electrical connector generally includes an insulating body and a terminal arranged in the insulating body, the terminal itself is provided with an elastic contact portion, and a conductive connection portion of the chip module is in compression joint with the elastic contact portion terminal to implement electrical contact. To ensure good elasticity of the elastic contact portion, the terminal typically is bent several times to form a long elastic arm, and the contact portion is provided on the elastic arm. The terminal with this type of elastic arm occupies a large space, and causes volume increase of the electrical connector. Over time, the resistance of the terminal may increase due to friction and oxidation of the terminal, which resulting in increases of contact resistance between the terminal and the conducting portion, and affecting signal transmission between the chip module and the circuit board.

Therefore, a heretofore unaddressed need exists in the art to address the aforementioned deficiencies and inadequacies.

SUMMARY OF THE INVENTION

In one aspect, the present invention is directed to an electrical connector that has a low height and a small impedance, so as to improve stability of electrical connection and signal transmission between a first electronic element and a second electronic element.

In one embodiment, the electrical connector for electrically connecting a first electronic element to a second electronic element includes an insulating body having multiple receiving holes. Each of the receiving holes is internally provided with a conducting assembly. The conducting assembly includes a first conductor and a liquid metal conductor. At least one part of the first conductor is a conducting layer arranged at an inner wall of the receiving hole. The liquid metal conductor is made of gallium or gallium alloy. The receiving hole is internally provided with a plug. An receiving cavity is formed above the plug. One end of the first conductor is formed into a welding portion. The liquid metal conductor is accommodated in the receiving cavity, and may be electrically connected to the first electronic element and the first conductor.

In one embodiment, the plug is an elastomer.

In one embodiment, an upper surface of the plug is provided with a wave shaped trench.

In one embodiment, a lower surface of the insulating body is provided with a groove surrounding the receiving hole.

In one embodiment, the receiving hole is provided with an urging portion.

In one embodiment, the conducting assembly further includes a second conductor, the second conductor is received in the receiving cavity, and the second conductor is located above the plug.

In one embodiment, the second conductor is in a sheet shape, a spherical shape or an inverted "T" shape.

In one embodiment, a surface of the second conductor is provided with a material compatible with the gallium or gallium alloy.

In one embodiment, the material is tin.

In one embodiment, an upper surface of the insulating body is provided with an elastic sealing layer.

In one embodiment, the welding portion is located below the receiving hole.

In one embodiment, the receiving hole is formed with a shrinkage limitation hole at a lower side of the insulating body.

In one embodiment, the welding portion is located at a lower surface of the insulating body.

In another aspect, the present invention is directed to an electrical connector for electrically connecting a first electronic element to a second electronic element, including an insulating body having multiple receiving holes. Each of the receiving holes is internally provided with a conducting assembly. The conducting assembly includes a first conductor and a second conductor. At least one part of the first conductor is a conducting layer arranged at an inner wall of the receiving hole. The receiving hole is internally provided with a plug. A receiving cavity is formed above the plug. One end of the first conductor is formed into a welding portion. The second conductor is received in the receiving cavity, and may be electrically connected to the first electronic element and the first conductor.

In one embodiment, the plug is an elastomer.

In one embodiment, when the first electronic element is pressed downward, the plug may generate an upward counter force against the second conductor and a counter force toward one side of the inner wall of the receiving hole at the same time.

In one embodiment, the plug is provided with a chamfer capable of urging the second conductor.

In one embodiment, a lower surface of the insulating body is provided with a groove surrounding the receiving hole.

In one embodiment, the receiving hole is provided with an urging portion.

In one embodiment, the second conductor is in a sheet shape, a spherical shape or an inverted "T" shape.

In one embodiment, the conducting assembly further includes a liquid metal conductor, the liquid metal conductor is received in the receiving cavity, and the liquid metal conductor is located at an upper surface of the plug.

In one embodiment, the liquid metal conductor is made of gallium or gallium alloy.

In one embodiment, a surface of the second conductor is provided with a material compatible with the gallium or gallium alloy.

In one embodiment, the material is tin.

In one embodiment, an upper surface of the insulating body is provided with an elastic sealing layer.

In one embodiment, the welding portion is located below the receiving hole.

In one embodiment, the receiving hole is formed with a shrinkage limitation hole at a lower side of the insulating body.

In one embodiment, the welding portion is located at a lower surface of the insulating body.

Compared with the related art, in certain embodiments of the present invention, the electrical connector achieves electrically conduction through the liquid metal conductor arranged in the receiving hole and the first conductor, i.e., the conducting layer disposed in the inner wall of the receiving hole. The liquid metal conductor directly or indirectly electrically connects the first electronic element. Meanwhile, the first conductor extends to form the welding portion to connect the second electronic element. Comparing with the related art using terminals, the manner of establishing main conducting path between the first electronic element and the second electronic element by using the liquid metal conductor and the conducting layer, can decrease the overall height of the electrical connector, and is advantages toward thinning tendency. Further, using the liquid metal conductor and the conducting layer to electrical connect the first electronic element and the second electronic element respectively, makes the electrical connection simple and easy, decreases contact resistance, and ensures good electrical transmission.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
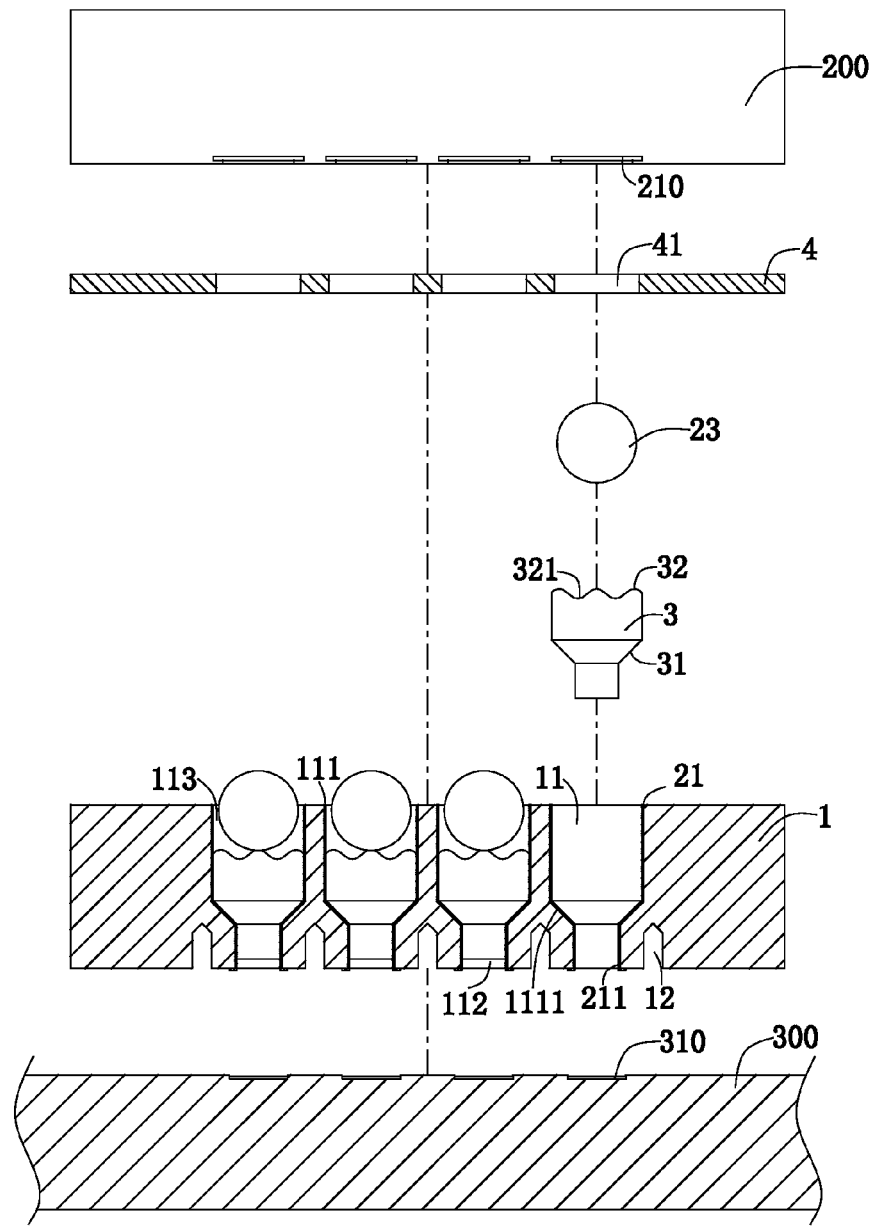
FIG. 1 is a schematic exploded view of a first embodiment of an electrical connector according to the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to an electrical connector.

Figure 2:
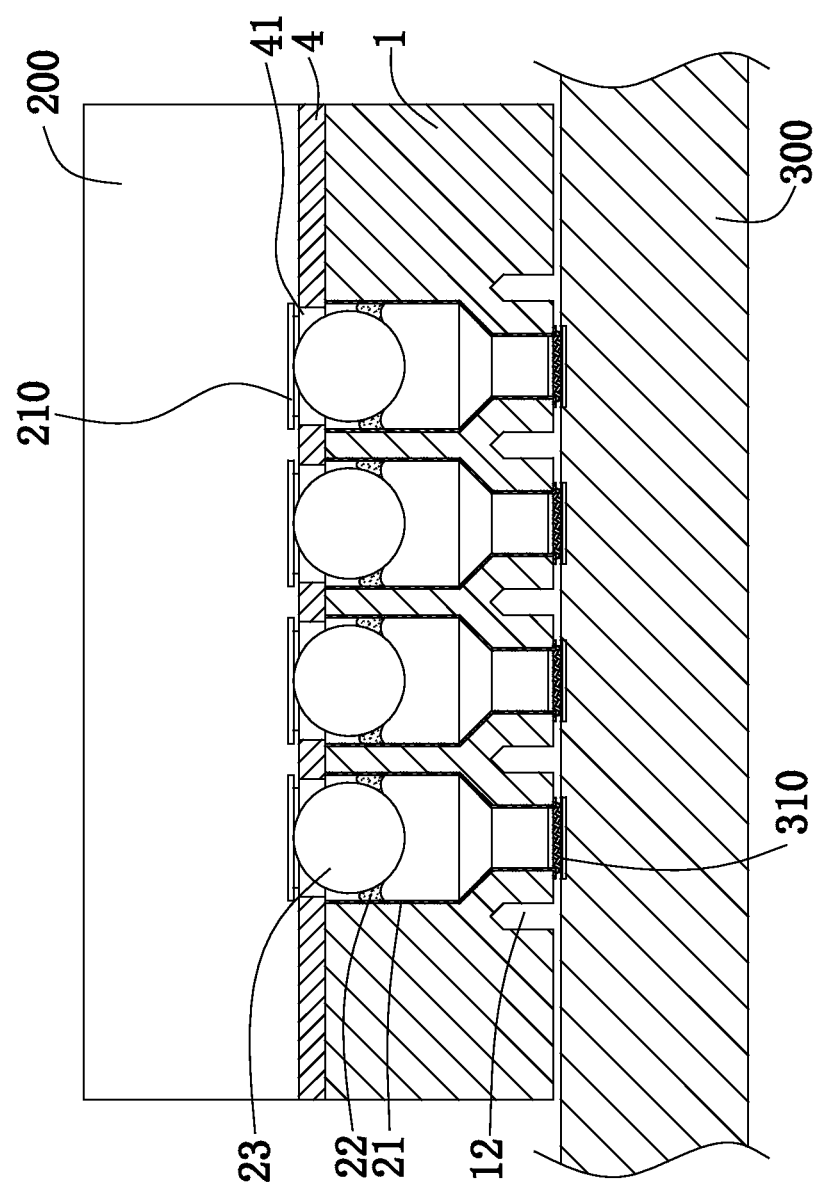
FIG. 2 is a schematic assembly view of the first embodiment of the electrical connector according to the present invention.
Figure 10:
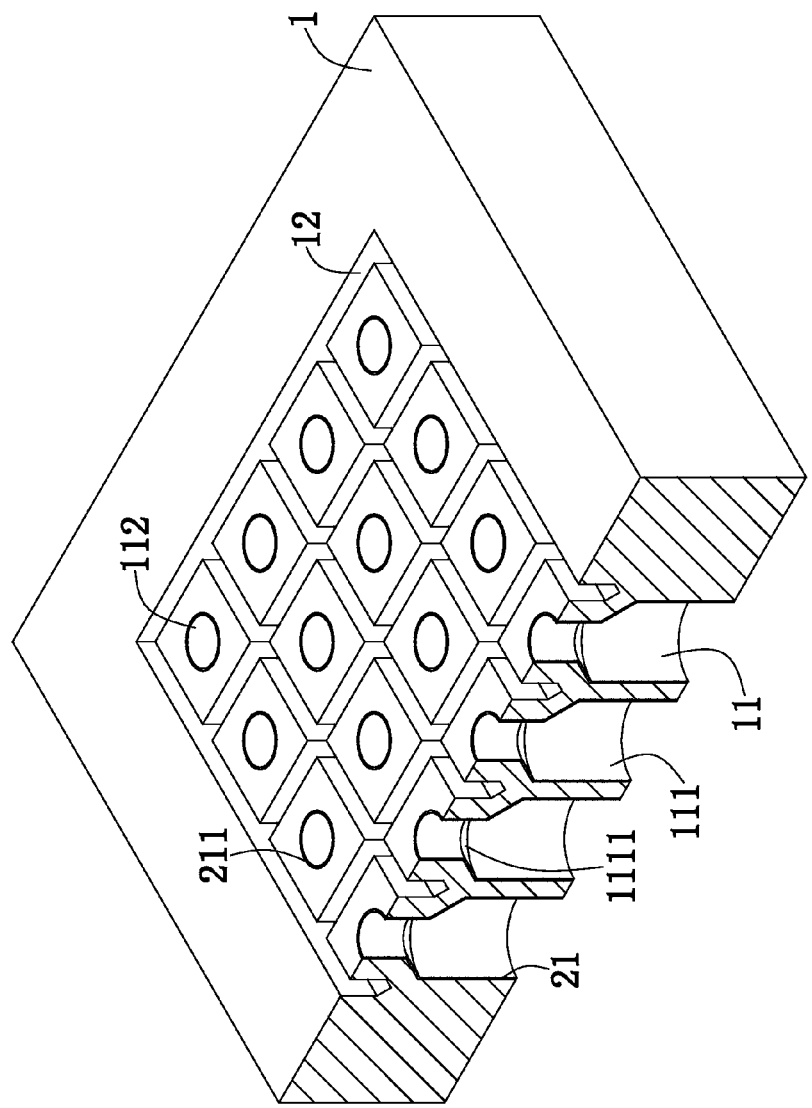
FIG. 10 is a schematic three-dimensional view of an insulating body of an electrical connector according to one embodiment of the present invention.

As shown in FIGS. 1, 2 and 10, as a first embodiment of an electrical connector of the present invention, the electrical connector is used for electrically connecting a first electronic element 200 and a second electronic element 300. The first electronic element 200 has multiple first conductive connection portions 210. The first conductive connection portion 210 may be a tin ball 210 or a contact pad 210. The circuit board 300 has multiple second conductive connection portions 310. The electrical connector includes an insulating body 1, multiple conducting assemblies, multiple plugs 3 and an elastic sealing layer 4. Each of the conducting assemblies includes a first conductor 21, a liquid metal conductor 22 and a second conductor 23. The conducting assemblies and the plugs 3 are accommodated in the insulating body 1.

The insulating body 1 is in a plate shape, and is made of a material which is not easily deformed. The insulating body 1 includes multiple receiving holes 11 for receiving the conducting assemblies. The receiving hole 11 runs through the upper surface and the lower surface of the insulating body 1. A shrinkage limitation hole 112 is formed in the lower surface of the insulating body 1, and a supporting portion 1111 is formed above the shrinkage limitation hole 112 and on an inner wall 111 of the receiving hole 11. The lower surface of the insulating body 1 is provided with a groove 12 surrounding the receiving hole 11, and the groove 12 may prevent the electrical connector from being short-circuited in a welding process, and prevent solder crack caused by the expansion of the electrical connector when being heated in a working process.

The conducting assembly includes a first conductor 21, a liquid metal conductor 22, and a second conductor 23. The first conductor 21 is a metal layer or metal plating layer arranged at the inner wall 111. One end of the first conductor 21 is exposed out of the lower surface of the insulating body 1, and is formed with a welding portion 211 that is used for being welded to the circuit board 300. The second conductor 23 may be spherical. The surface of the second conductor 23 is provided with a material (not shown) compatible with the gallium or gallium alloy, and in one embodiment, the material is tin. The liquid metal conductor 22 is made of gallium or gallium alloy, where the gallium alloy is gallium-tin alloy, gallium-indium alloy or gallium-indium-tin alloy. The melting point of gallium is about 29.76° C., so gallium metal may be used directly as the liquid metal conductor 22. The melting point of indium is about 156.61° C., the melting point of tin is about 231.93° C., but the melting point of binary or ternary alloy of indium, gallium, and tin may be greatly reduced. The melting point of the foregoing alloy differs according to different proportions. For example, when the indium-gallium proportion is 24.5:75.5, the melting point of binary alloy of indium and gallium is 15.7° C., when the indium-gallium-tin proportion is 20.5:66.5:13.0, the melting point of ternary alloy of indium, gallium and tin is 10.7° C., so the liquid metal conductor 22 may further be any one of indium-gallium, gallium-tin, and indium-gallium-tin. A user may prepare alloy by use of gallium metal, or by use of indium, gallium, and tin metal according to a proportion, so that at the normal temperature or room temperature, the gallium metal or the gallium alloy is in liquid form. Therefore, the contact area between conductors is large, the impedance is small, and during current transmission, energy is consumed not due to the impedance, thereby ensuring stability of the current transmission, and good electrical connection effect.

The plug 3 is an elastomer, and the plug 3 is provided with an urging portion 31 matching with the supporting portion 1111. When the plug 3 is plugged into the receiving hole 11, depending on cooperation between the urging portion 31 and the supporting portion 1111, the plug 3 may be retained in the receiving hole 11. The plug 3 partially fills the receiving hole 11, therefore an receiving cavity 113 is formed above the plug 3, and the receiving cavity 113 is used for receiving the liquid metal conductor 22 and the second conductor 23. In order to better accommodate the liquid metal conductor 22, some wave shaped trenches 321 may be arranged on an upper end face 32 of the plug 3. By arranging the wave shaped trenches 321, the liquid metal conductor 22 may be better retained in the receiving cavity 113, and the electric performance of the electrical connector may be improved to certain extent.

The upper surface of the insulating body 1 is further provided with an elastic sealing layer 4, and the elastic sealing layer 4 is provided with multiple through-holes 41 corresponding to the receiving holes 11. When the first electronic element 200 is pressed downward, the upper surface and the lower surface of the elastic sealing layer 4 are tightly laminated with the lower surface of the first electronic element 200 and the upper surface of the insulating body 1 respectively, which may prevent the liquid metal conductor 22 in the receiving hole 11 from leakage, and thereby may prevent liquid metal conductors 22 in neighboring receiving holes 11 from being stuck to each other, thereby preventing the short-circuited phenomenon.

When the electrical connector is electrically connected to the first electronic element 200 and the second electronic element 300, the first conductor 21 may form a conducting path with the second conductor 23 by using the liquid metal conductor 22, and the first electronic element 200 may be electrically connected to the second electronic element 300 by using the conducting path. In the assembly process, when the first electronic element 200 is pressed downward, the plug 3 may generate an upward counter force and a counter force toward one side of the inner wall 111 for the second conductor 23 at the same time.

Figure 3:
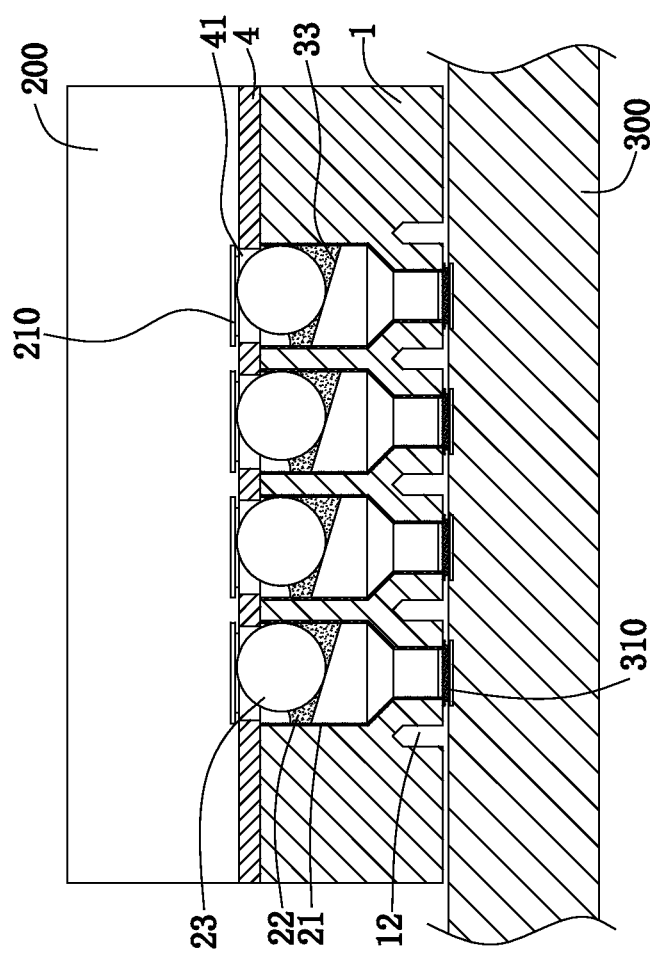
FIG. 3 is a schematic exploded view of a second embodiment of the electrical connector according to the present invention.

As shown in FIG. 3, as a second embodiment of the present invention, the electrical connector and the electrical connector of the first embodiment are different in that, the plug 3 is disposed with a chamfer 33 for urging against the second conductor 23. When the first electronic element 200 is pressed downwardly, the plug 3 exerts a counter force against the second conductor 23 upwardly, and the chamfer 33 exerts a counter force against the second conductor 23 towards one side of the inner wall of the receiving hole 11, resulting in movement of the second conductor 23 towards the one side of the inner wall, such that the second conductor 23 is in tight contact with the first conductor 21, and the liquid metal conductor 22 is attached between the second conductor 23 and the one side of the inner wall of the receiving hole 11. In other embodiments, the structure of the plug 3 that exerts sideward force towards the second conductor 23 can be in a shape of an arc surface or a spherical surface, which is not listed herein.

Figure 4:
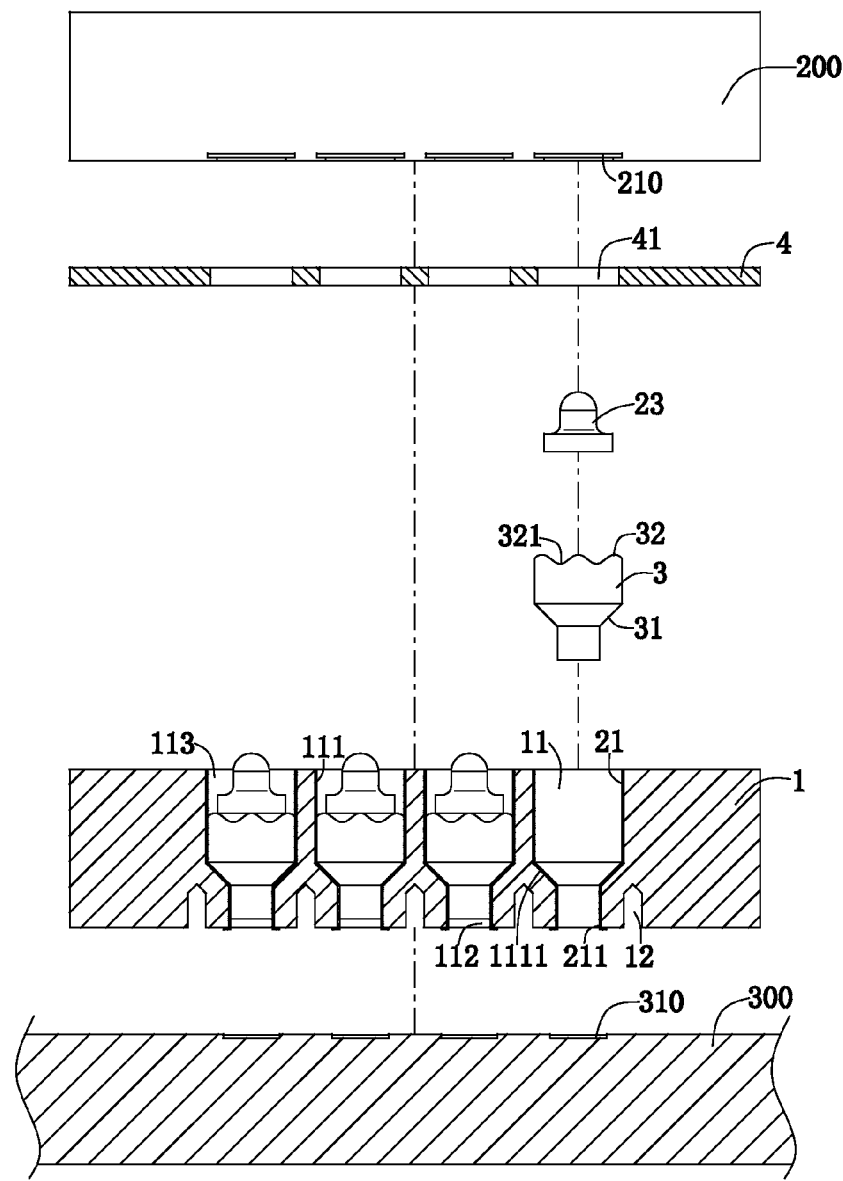
FIG. 4 is a schematic exploded view of a third embodiment of the electrical connector according to the present invention.
Figure 5:
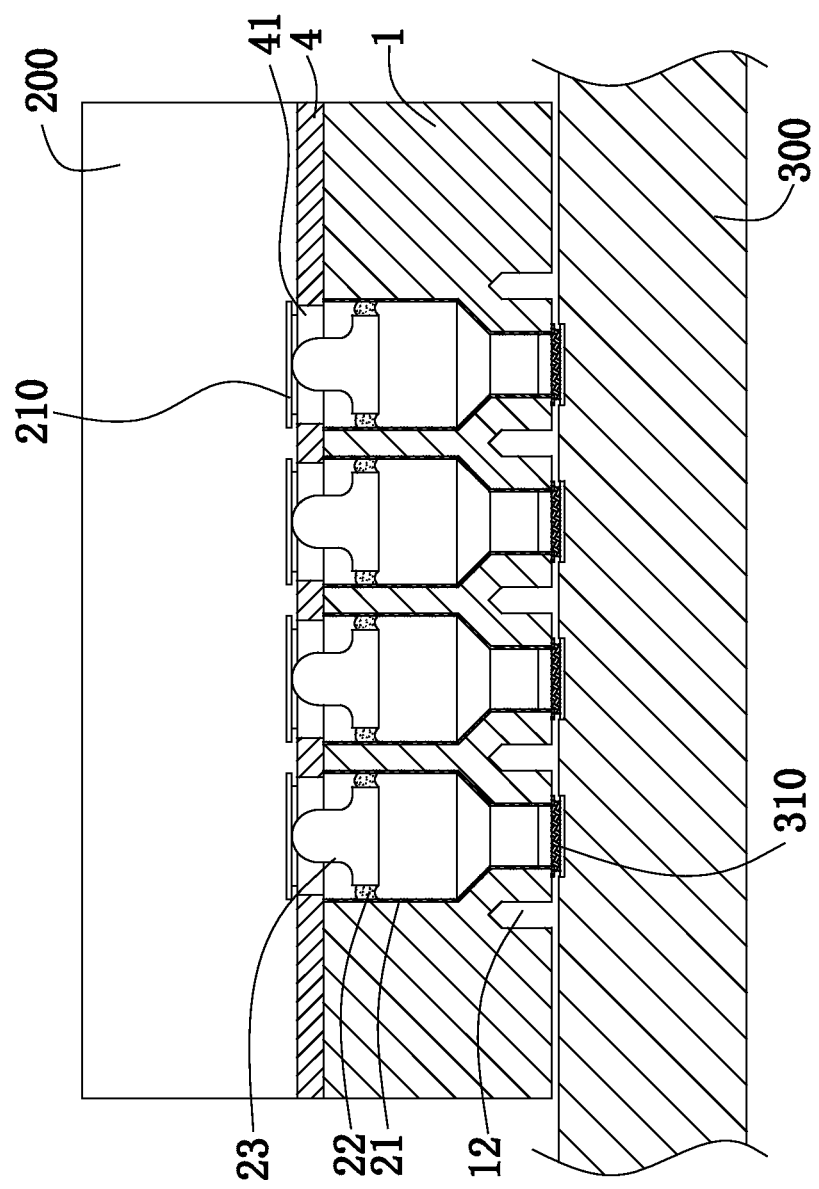
FIG. 5 is a schematic assembly view of the third embodiment of the electrical connector according to the present invention.

As shown in FIG. 4 and FIG. 5, as a third embodiment of the present invention, the electrical connector and the electrical connector of the first embodiment are different in that, the second conductor 23 is in an inverted "T" shape.

Figure 6:
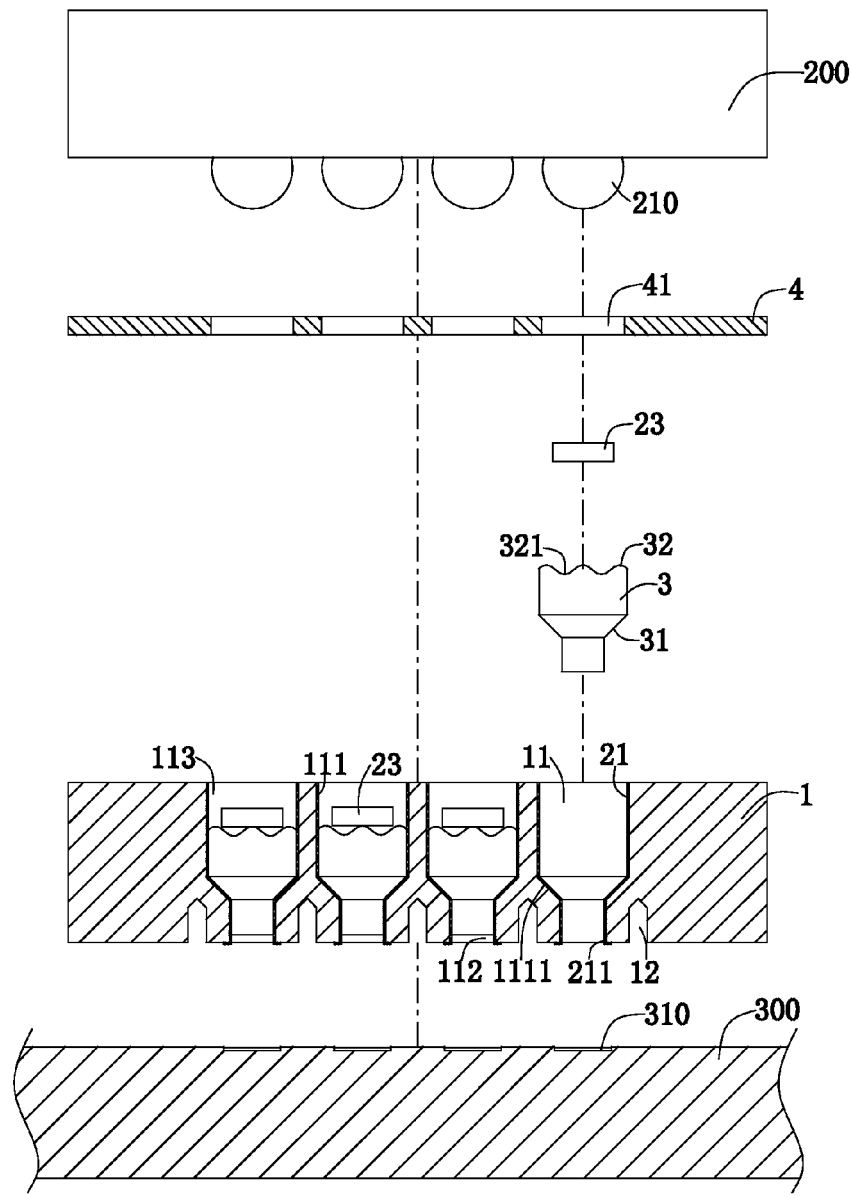
FIG. 6 is a schematic exploded view of a fourth embodiment of the electrical connector according to the present invention.
Figure 7:
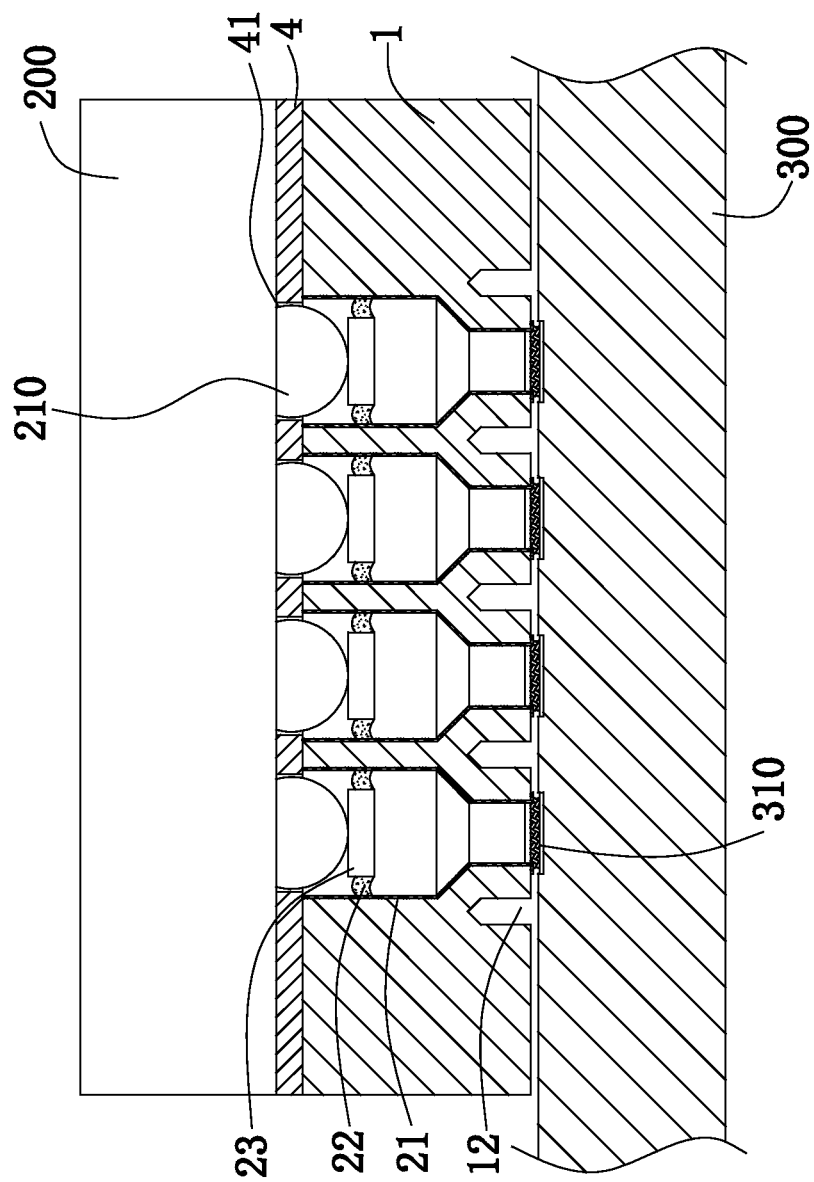
FIG. 7 is a schematic assembly view of the fourth embodiment of the electrical connector according to the present invention.

As shown in FIG. 6 and FIG. 7, as a fourth embodiment of the present invention, the electrical connector and the electrical connector of the first embodiment are different in that, the second conductor 23 is in a sheet shape.

Figure 8:
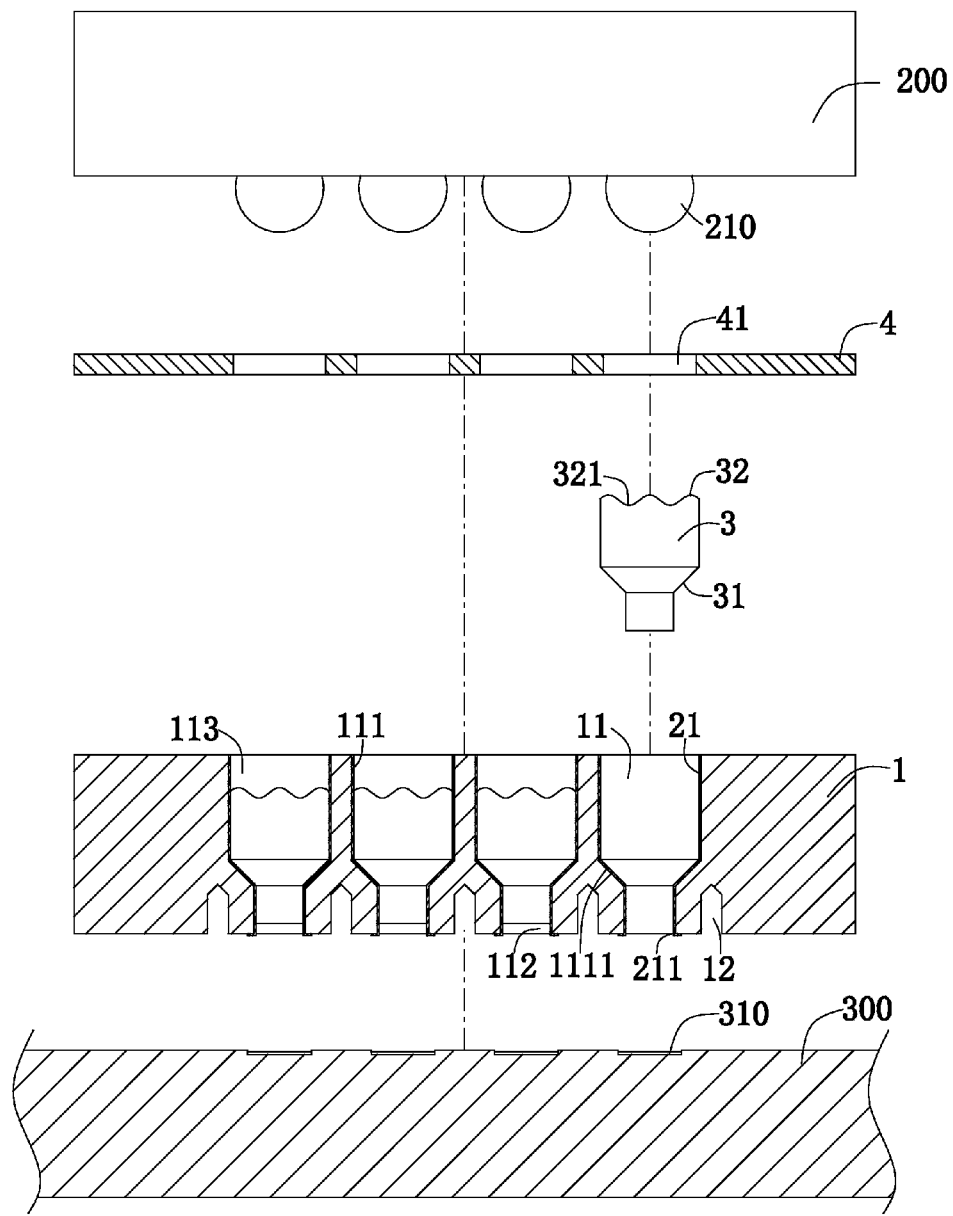
FIG. 8 is a schematic exploded view of a fifth embodiment of the electrical connector according to the present invention.
Figure 9:
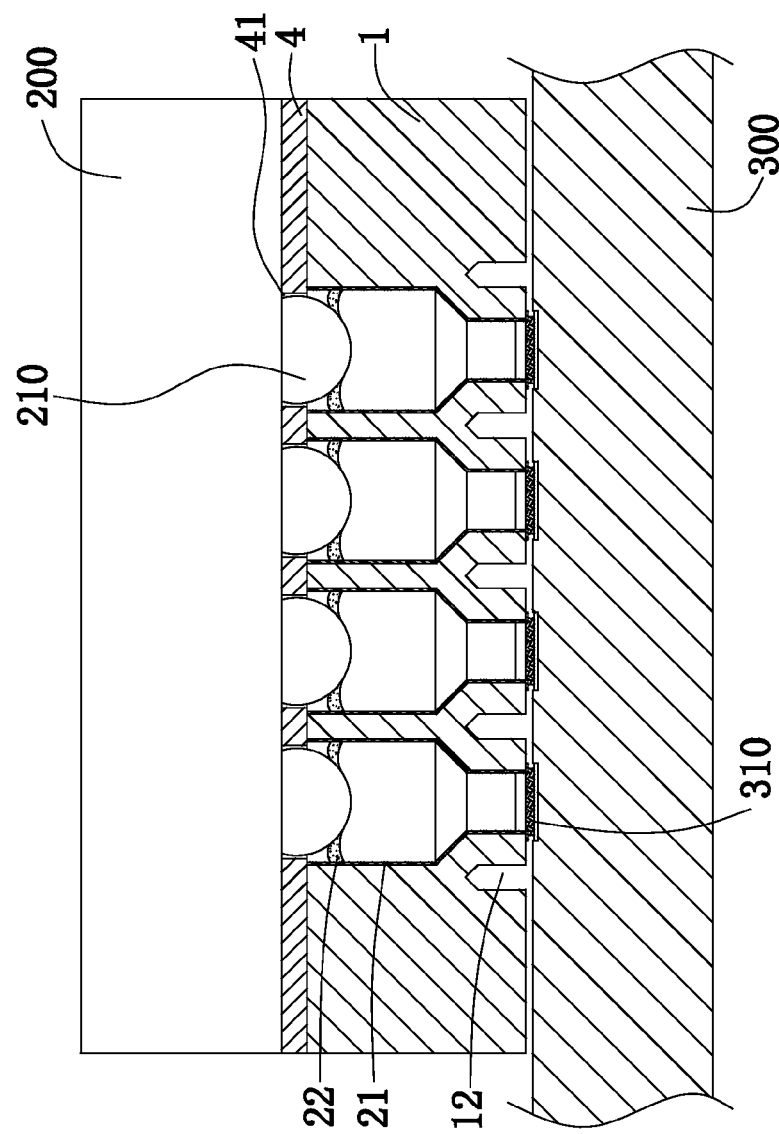
FIG. 9 is a schematic assembly view of the fifth embodiment of the electrical connector according to the present invention.

As shown in FIG. 8 and FIG. 9, as a fifth embodiment of the present invention, the electrical connector and the electrical connector of the first embodiment are different in that, the first electronic element 200 conductively connecting the liquid metal conductor 22 disposed in the receiving hole 11 directly. Specifically, the conducting assembly 2 includes only a first conductor 21 and a liquid metal conductor 22, where the first conductor 21 and the liquid metal conductor 22 form a conducting path. The first electronic element 200 may be electrically connected to the second electronic element 300 by using the conducting path. This embodiment may also achieve the objective and the technical effect of the first embodiment, which are not described herein anymore.

In summary, the electrical connector according to certain embodiment of the present invention, has the following beneficial advantages.

(1) The electrical connector according to certain embodiments of the present invention achieves electrically conduction through the liquid metal conductor 22 arranged in the receiving hole 11 and the first conductor 21, i.e., the first conducting layer disposed in the inner wall of the receiving hole 11. The liquid metal conductor 22 directly or indirectly electrically connects the first electronic element 200. Meanwhile, the first conductor 21 extends downwardly to form the welding portion to connect the second electronic element 300. Comparing with the related art using terminals, the manner of establishing main conducting path between the first electronic element 200 and the second electronic element 300 by using the liquid metal conductor and the conducting layer, can decrease the overall height of the electrical connector, and is advantages toward thinning tendency. Further, using the liquid metal conductor and the conducting layer to electrical connect the first electronic element 200 and the second electronic element 300 respectively, makes the electrical connection simple and easy, decreases contact resistance, and ensures good electrical transmission.

(2) By arranging the liquid metal conductor 22 in the receiving hole 11, the electrical connector is electrically conducted with the first conductor 21. When the first conductive connection portion 210 of the first electronic element 200 enters the receiving hole 11, the liquid metal conductor 22 sticks and contacts the first conductive connection portion 210, and the liquid metal conductor 22 is formed with a conducting path between the first conductive connection portion 210 and the first conductor 21. By this manner of establishing the conducting path using the liquid metal conductor 22, if the first electronic element 200 slightly vibrates under the action of an external force, at least one part of the surface of the first conductive connection portion 210 is still stuck with the liquid metal conductor 22, thereby avoiding the transient interruption phenomenon generated between the first conductive connection portion 210 and the electrical connector. Further, the electrical connector is still electrically conducted with the second electronic element 300 using the first conductor 21, thereby ensuring good signal transmission between the first electronic element 200 and the second electronic element 300.

(3) By arranging the groove 12 on the lower surface of the insulating body 1, the electrical connector may be prevented from being short-circuited in the welding process, and the solder crack phenomenon caused by the expansion of the electrical connector when being heated in the working process may be prevented.

(4) The surface of the second conductor 23 is provided with a material compatible with the gallium or gallium alloy, and the electric performance between the liquid metal conductor 22 and the second conductor 23 may be effectively improved.

(5) The elastic sealing layer 4 is arranged above the insulating body 1, so the elastic sealing layer 4 may prevent liquid metal conductors 22 in neighboring receiving holes 11 from leakage, and thereby may prevent the liquid metal conductors 22 in the neighboring receiving holes 11 from being stuck to each other, thereby impeding the short-circuited phenomenon.

(6) By arranging the plug 3, the liquid metal conductor 22 may be stopped and accommodated, and the short-circuited phenomenon brought about due to unequal heights of the first conductive connection portions 210 may be further effective prevented.

(7) By arranging some wave shaped trenches 321 on the upper end face 32 of the plug 3, the liquid metal conductor 22 may be better retained in the receiving cavity 113, and the electric performance of the electrical connector may be improved to certain extent.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a first electronic element to a second electronic element, comprising:
    an insulating body having a plurality of receiving holes,
    wherein each of the receiving holes is internally provided with a conducting assembly;
    wherein the conducting assembly comprises a first conductor, a second conductor, and a liquid metal conductor, at least one part of the first conductor is a conducting layer arranged at an inner wall of the receiving hole, the liquid metal conductor is made of gallium or gallium alloy;
    wherein the receiving hole is internally provided with a plug that is an elastomer, the plug seals with the first conductor, and an receiving cavity is formed above the plug; and
    wherein the second conductor and the liquid metal conductor are accommodated in the receiving cavity, the second conductor is supported by the plug to contact the first electronic element, and contacts the first conductor through the liquid metal conductor, and one end of the first conductor is formed into a welding portion for electrically connecting to the second electronic element.

2. The electrical connector according to claim 1, wherein an upper surface of the plug is provided with a wave shaped trench.

3. The electrical connector according to claim 1, wherein a lower surface of the insulating body is provided with a groove surrounding the receiving hole.

4. The electrical connector according to claim 1, wherein the receiving hole comprises an urging portion.

5. The electrical connector according to claim 1, wherein the second conductor is in a sheet shape, a spherical shape or an inverted "T" shape.

6. The electrical connector according to claim 1, wherein a surface of the second conductor is provided with a material compatible with the gallium or gallium alloy.

7. The electrical connector according to claim 6, wherein the material is tin.

8. The electrical connector according to claim 1, wherein an upper surface of the insulating body is provided with an elastic sealing layer.

9. The electrical connector according to claim 1, wherein the welding portion is located below the receiving hole.

10. The electrical connector according to claim 1, wherein the receiving hole is formed with a shrinkage limitation hole at a lower side of the insulating body.

11. The electrical connector according to claim 1, wherein the welding portion is located at a lower surface of the insulating body.

12. The electrical connector according to claim 1, wherein when the first electronic element is pressed downward, the plug generates an upward counter force against the second conductor and a counter force toward one side of the inner wall of the receiving hole at the same time.

13. The electrical connector according to claim 1, wherein the plug is provided with a chamfer capable of urging the second conductor.

* * * * *